United States Patent
Raje

[11] Patent Number: 6,105,123
[45] Date of Patent: Aug. 15, 2000

[54] HIGH SPEED REGISTER FILE ORGANIZATION FOR A PIPELINED COMPUTER ARCHITECTURE

[75] Inventor: Prasad A. Raje, Fremont, Calif.

[73] Assignee: Hewlett-Packard Company, Palo Alto, Calif.

[21] Appl. No.: 09/038,364

[22] Filed: Mar. 10, 1998

[51] Int. Cl.[7] ........................................... G06F 9/00
[52] U.S. Cl. .................. 712/24; 364/63; 364/230.05; 364/189.04
[58] Field of Search ................ 712/1, 24; 711/5; 365/63, 230.05, 189.04

[56] References Cited

U.S. PATENT DOCUMENTS

| | | | |
|---|---|---|---|
| 5,226,142 | 7/1993 | Vegesna et al. | 365/230.02 |
| 5,392,411 | 2/1995 | Ozaki | 395/400 |
| 5,424,969 | 6/1995 | Yamada et al. | 708/603 |
| 5,513,363 | 4/1996 | Kumar et al. | 395/800 |
| 5,590,087 | 12/1996 | Chung et al. | 365/230.05 |
| 5,615,386 | 3/1997 | Amerson et al. | 395/585 |
| 5,704,054 | 12/1997 | Bhattacharya | 712/212 |
| 5,721,868 | 2/1998 | Yung et al. | 711/149 |

*Primary Examiner*—Meng-Ai T. An
*Assistant Examiner*—Gautam R. Patel

[57] ABSTRACT

A register file organization for a pipelined microprocessor is shown which includes a pipestage register interposed a global bit line and a register cell array of the register file in order to separate the delay associated with driving the global bit line, and devices attached to the global bit line, into a separate pipestage. Another register file organization is shown which includes a pipestage register that is interposed a register cell array and a decoder, which selects a register in the register cell array responsive to an instruction in an instruction register, to separate the decoder function and register cell array access times into different pipestages. The two approaches can be combined to separate the delay associated with the decoder, register cell array and global bit line into different pipestages in order to reduce the pipestage cycle time toward a fundamental minimum for pipelined computer architecture.

19 Claims, 6 Drawing Sheets

HIGH SPEED REGISTER FILE ORGANIZATION FOR A PIPELINED COMPUTER ARCHITECTURE

BACKGROUND OF THE INVENTION

This invention relates generally to computer organization and more particularly to a register file and pipeline organization in a computer architecture having a large number of registers.

A typical multiported register file 10 is shown in FIG. 1. The register file 10 includes N registers each having M read ports and at least one write port. Coupled to the register file 10 are instruction decoders 12 which decode instructions held in a number L of instruction registers 14. Typically there are two read ports for each instruction register, i.e., M=2×L, to allow both source operands to be fetched simultaneously. The plurality of registers 14 include L registers, with each register being associated with a corresponding functional unit (not shown). This organization is typical for a superscalar architecture or a very long word instruction word (VLIW) architecture, wherein each instruction register 14 is associated with a corresponding functional unit. The decoders 12 decode the register fields of the instruction registers 14 and select the corresponding register in the register file 10. Also coupled to the register file 10 are a plurality of registers 16. Each of the registers 16 is coupled to a respective one of the output ports or read ports of the register file 10.

A detailed schematic of an individual register cell 18 of the register file 10 is shown in FIG. 2. The cell 18 includes two inverters I1 and I2 connected in a circular fashion to form the basis of the register cell. The register cell of FIG. 2 includes two read ports (P1 and P2) and a single write port (W). The write port includes pass transistor 20 connected between a write bit line Bit Line W and an input of the register cell. The first read port includes transistors 22 and 26 and the second read port includes transistors 24 and 25, each port being connected in a conventional manner, as is known in the art. It is apparent that with the addition of each read port the size of the register cell increases. This increased size of the register cell increases the access time of the overall register file due to the increase in capacitance and resistance of the individual cells. This problem is exacerbated if the number of registers in the register file is relatively large as well because of the increased capacitance and resistance of the bit lines in the register file. In fact, it can be shown that the access time is a quadratic function of the number of functional units and the number of registers.

Simulations of the register file of FIGS. 1 and 2 demonstrate the relationship of the access time of the register file as a function of the number of functional units and the number of registers in the register file. The results of these simulations are shown in FIG. 3. In FIG. 3, the access time of the register file ($T_{ACCESS}$) is plotted as a function of the number of functional units for a number of different sized register files. The access time as a function of the number of functional units for register files having 32, 64, 128, 192 and 256 is shown in plots 32, 34, 36, 38 and 40, respectively, in FIG. 3.

In a microprocessor having a pipelined architecture, the cycle time, the time allocated to the execution of each pipestage, is determined by the operation that must be performed in a single stage that has the longest time interval. Because each cycle of the microprocessor typically has the same time duration, the cycle time cannot be less than the operation having the longest time interval. The operational path in a microprocessor associated with the longest execution time interval is therefore referred to as the critical path of the microprocessor.

In the past, the critical path in a microprocessor has been associated with a functional unit in the processor, such as an arithmetic logic unit (ALU) which may require a relatively long period of time to perform a complex operation upon data. However, as the number of functional units and/or number of registers within microprocessors increases, the access time of the register file $T_{ACCESS}$ can become the critical path of the microprocessor. For example, assuming a critical path of two nanoseconds, for a register file having 128 registers, a computer architecture having over four functional units will result in the register file becoming the critical path in the computer. This relationship is shown in plot 36 of FIG. 3. Superscalar or VLIW architectures are capable of supporting significantly more functional units than four. As a result, the access time for the register file in superscalar or VLIW architectures can become a significant obstacle to achieving very fast cycle times.

One approach to alleviating the time required for accessing the register file has been to divide the register file. FIG. 4 illustrates an example of a divided register file in a pipelined microprocessor architecture. Instruction registers 42 and 72 each receive an instruction for execution which can include an access to a register in either cell array 50 or cell array 60. Row decoders 44 and 74 decode the instruction in registers 42 and 72. A successful decode in either row decoder 44 or 74 will result in a register word line output to word line driver 46 or 76, respectively. Word line drivers 46 and 76, in turn, drive the word line corresponding to the selected register in the corresponding cell arrays 50 or 60 in order to access a cell 52 or 62 within arrays 50 and 60, respectively. Only one of cell array 50 or cell array 60 will typically be accessed in a given pipeline cycle and enable logic 92, which receives the word line outputs (or register selection signals) from row decoders 44 and 74, enables one of word line drivers 54 and 64 to drive GLOBAL BIT LINE.

When cell 52 or 62 is activated responsive to the word line output from drivers 46 and 74, then the cells will drive their data onto the corresponding LOCAL BIT LINE, which is typically relatively long resulting in a high capacitance and slow response, and into the corresponding sense amplifier 54 or 64, respectively. The sense amps 54 and 64, only one of which is active at a given time, drive the data from cell 52 or 62 onto the GLOBAL BIT LINE which is input to bypass multiplexor (MUX) 80. The GLOBAL BIT LINE is also typically long, since the bypass MUX can be located at a significant distance from the register file, and therefore has a high capacitance and relatively slow response. Finally, the output of bypass MUX 80 is captured by pipestage register 90 for output, during the next pipestage, to a functional unit for execution of an operation upon the register data captured by the pipestage register.

The instruction registers 42 and 72 and the pipeline register 90 are each clocked as part of the instruction pipeline and represent pipestages in an instruction pipeline. Therefore, the pipestage delay for a register file access in the circuit of FIG. 4, using the path from instruction register 42 to pipestage register 90 for example, is composed of the accumulated delays of row decoder 44, word line driver 46, cell 52, the LOCAL BIT LINE for cell 52, sense amp 54, the GLOBAL BIT LINE and bypass MUX 80 plus the set-up time for pipestage register 90.

A simplified example of a succession of pipestages in the register organization of FIG. 4 is shown in FIG. 6A. Each register access stage REG ACCESS produces the data required for a subsequent execution stage EXECUTE. Once the microprocessor pipeline is full, then the register access stage for the next execution stage takes place concurrently with the EXECUTION stage for the current instruction, as demonstrated in the time intervals from T1 to T2, T2 to T3, and T3 to T4 which correspond to cycle times of the microprocessor pipeline. In the interval from T1 to T2, the REGISTER ACCESS pipestage for a second instruction in an execution sequence INSTR2 takes place at the same time that the EXECUTION pipestage is performed for a preceding instruction INSTR1 in the execution sequence.

When the register access is the critical path in the execution pipeline, then the cycle time can be no less than the time required for a register access stage which includes the delays of all the components in the path through the register file, as discussed above. FIG. 6A is a simplified representation of a pipestage sequence. There are typically other pipestages for other operations, such as an instruction fetch pipestage.

There are a variety of ways of constructing a divided register file which may omit or add certain elements or combine the elements somewhat differently. Commonly assigned U.S. Pat. No. 5,513,363 illustrates another example of a divided register file solution in a pipelined architecture. However, despite the access time reductions obtained through subdivision of register files, register files continue to grow in size and, accordingly, continue to represent a limitation on the minimum cycle time in microprocessors.

Accordingly, a need remains for lowering the cycle time in a pipelined computer architecture having a register file and multiple functional units.

SUMMARY OF THE INVENTION

It is, therefore, an object of the invention to lower the register file access time in a microprocessor having a pipelined architecture.

An embodiment of a register file for a pipelined computer architecture, according to the present invention, includes a first instruction register configured to receive an instruction, a first cell array which includes a first plurality of registers, a first instruction decoder coupled between the first cell array and the first instruction register and which generates a first word line signal in order to select one of the first plurality of registers responsive to the instruction in the first instruction register. A bypass multiplexor receives the content of the selected register in the first plurality of registers. And a first pipestage register is interposed the bypass multiplexor and the first cell array and latches the content of the selected one of the first plurality of registers.

Another embodiment of a register file according to the present invention further includes a second pipestage register interposed the first instruction decoder and the first cell array which latches the first word line signal output from the first instruction decoder.

An embodiment of a method for minimizing a cycle time of a pipelined microprocessor having a register file, according to the present invention, includes providing a first micro-register file including a first plurality of data registers, latching an instruction in a first instruction register, decoding the instruction in the first instruction register to generate a first register selection signal, and enabling one of the first plurality of data registers responsive to the first register selection signal. The method then calls for latching the content of the one of the first plurality of registers into a first pipestage register and driving the content of the first pipestage register onto a global bit line. Another embodiment of the method according to the present invention calls for latching the first register selection signal into a second pipestage register.

An embodiment of a method for dividing a register access pipeline stage in a microprocessor, according to the present invention, includes latching an instruction into a first instruction register, decoding the instruction in the first instruction register in order to produce a first register selection signal, latching the first register selection signal into a first pipestage register. The method then calls for enabling one of a first plurality of data registers in a first register file responsive to the first register selection signal latched into the first pipestage register and driving the content of the one of the first plurality of data registers onto a global bit line.

An embodiment of a method for dividing an instruction pipeline in a microprocessor according to the present invention involves allocating the delay associated with a first instruction decoder and a first micro-register file to a first pipestage and allocating the delay associated with driving a global bit line and a bypass multiplexor into a second pipestage. The instruction pipeline can be further divided by allocating the delay associated with the first instruction decoder into a third pipestage.

In an embodiment of a microprocessor having an instruction pipeline, according to present invention, the instruction pipeline includes a first pipestage having a first instruction register, a first instruction decoder and a first micro-register file coupled in series and a second pipestage having a first pipestage register, a global bit line and a bypass multiplexor coupled in series, wherein the first and second pipestages are coupled in series with one another. The instruction pipeline can also include a third pipestage which includes the first instruction register and the first instruction decoder coupled in series and a fourth pipestage which includes a second pipestage register and the first micro-register file, wherein the third and fourth pipestages are coupled in series with one another.

An embodiment of a method for minimizing access time of a register file for a computer architecture having a pipelined architecture, according to the present invention, includes storing an instruction in a first instruction register, decoding the instruction in the first instruction register during a first pipeline cycle and selecting a data register in the register file, storing the content of the register selected during the first pipeline cycle, and driving the content of the register selected during the first pipeline cycle onto a global bit line during a second pipeline cycle subsequent to the first pipeline cycle.

An advantage of the present invention is that the smaller register file access time can reduce the cycle time of the pipeline in a microprocessor.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

In the following figures, where elements of different drawings are the same between figures, the same reference number is used to identify the same element.

DETAILED DESCRIPTION

Figure 1:
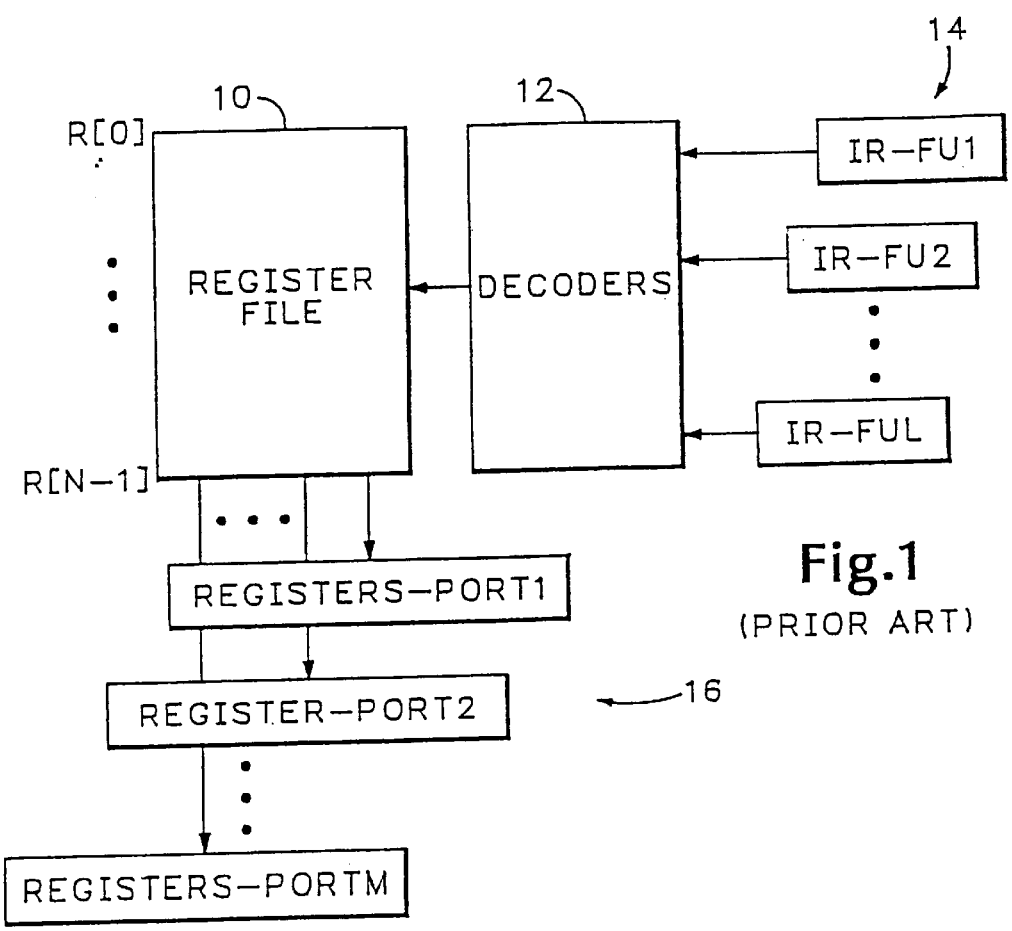
FIG. 1 is a block diagram of a prior art register file organization.
Figure 2:
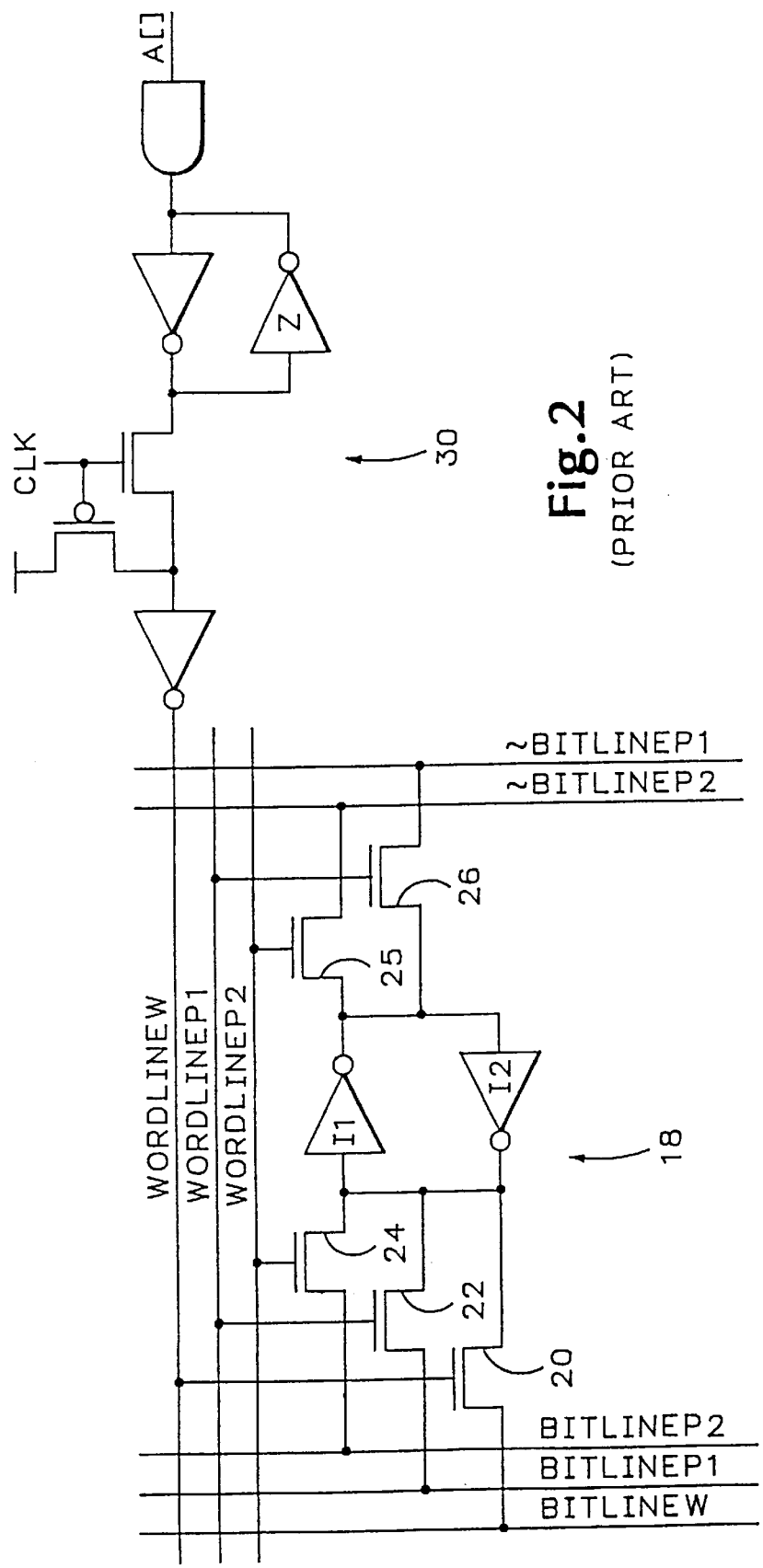
FIG. 2 is a schematic drawing of a register cell of the register file of FIG. 1.
Figure 3:
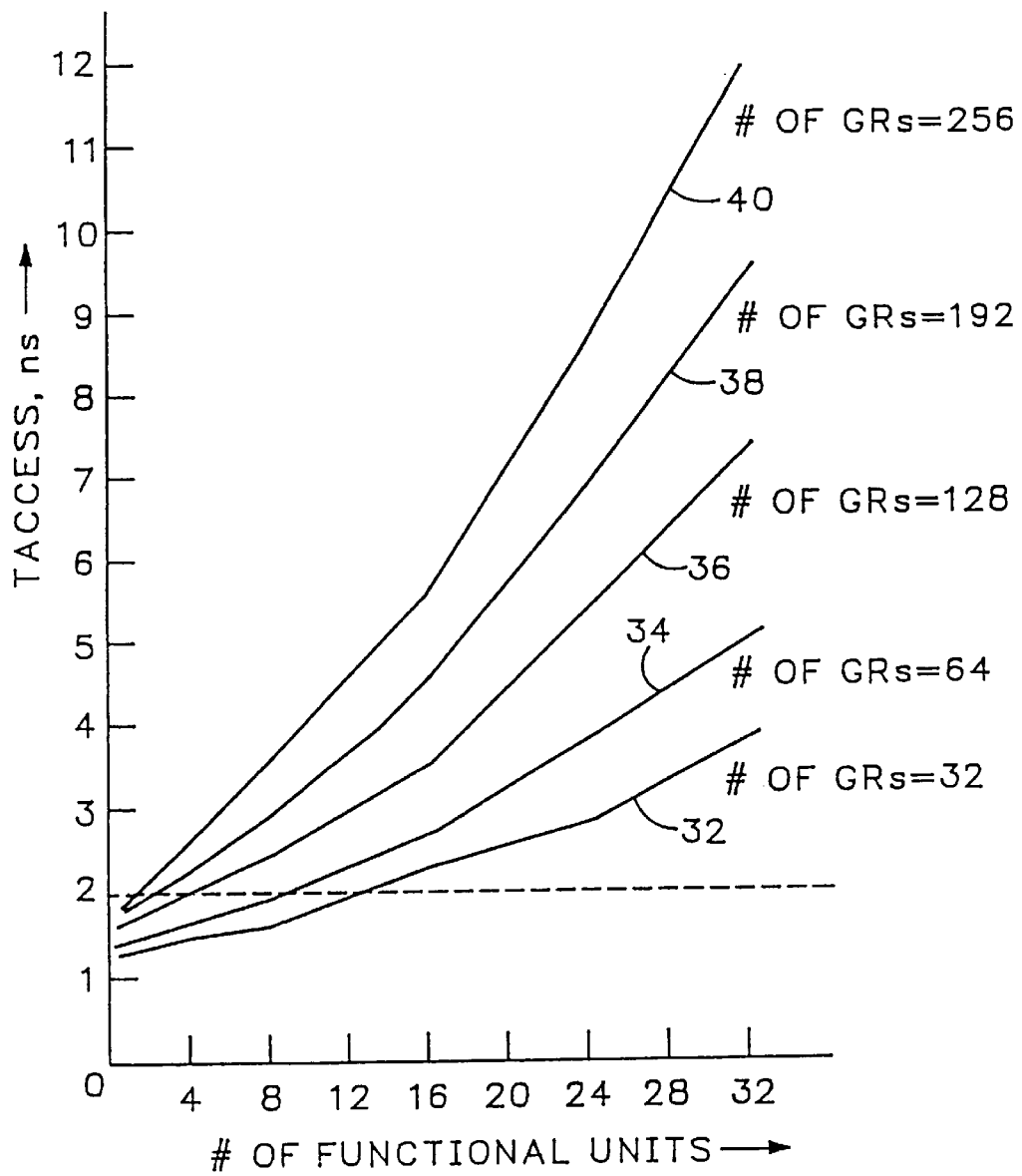
FIG. 3 is a plot of the access time of the register file organization of FIG. 1 as a function of the number of functional units for various sized register files.
Figure 4:
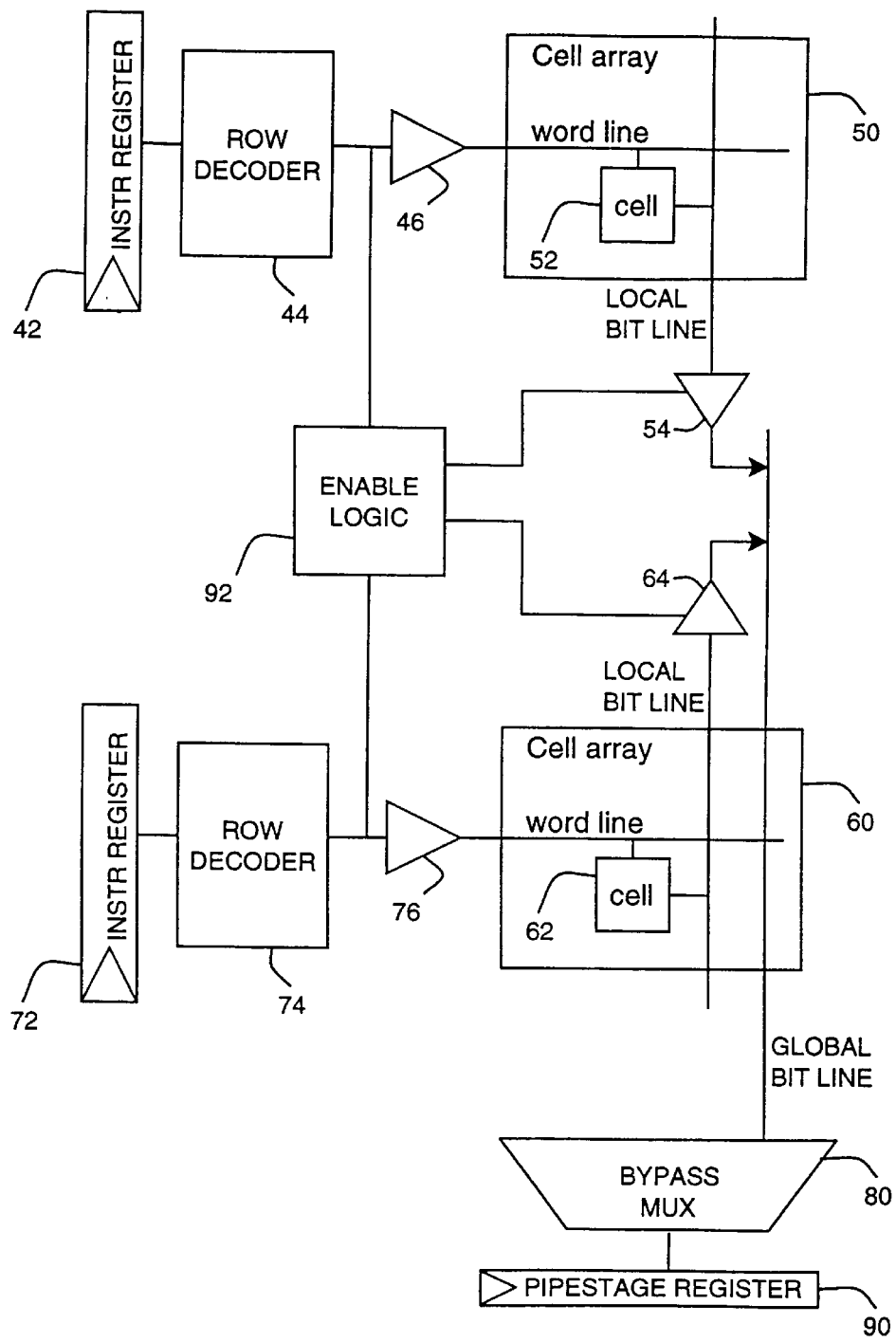
FIG. 4 is a block diagram of a conventional register file organization in a microprocessor having a pipelined architecture.
Figure 5:
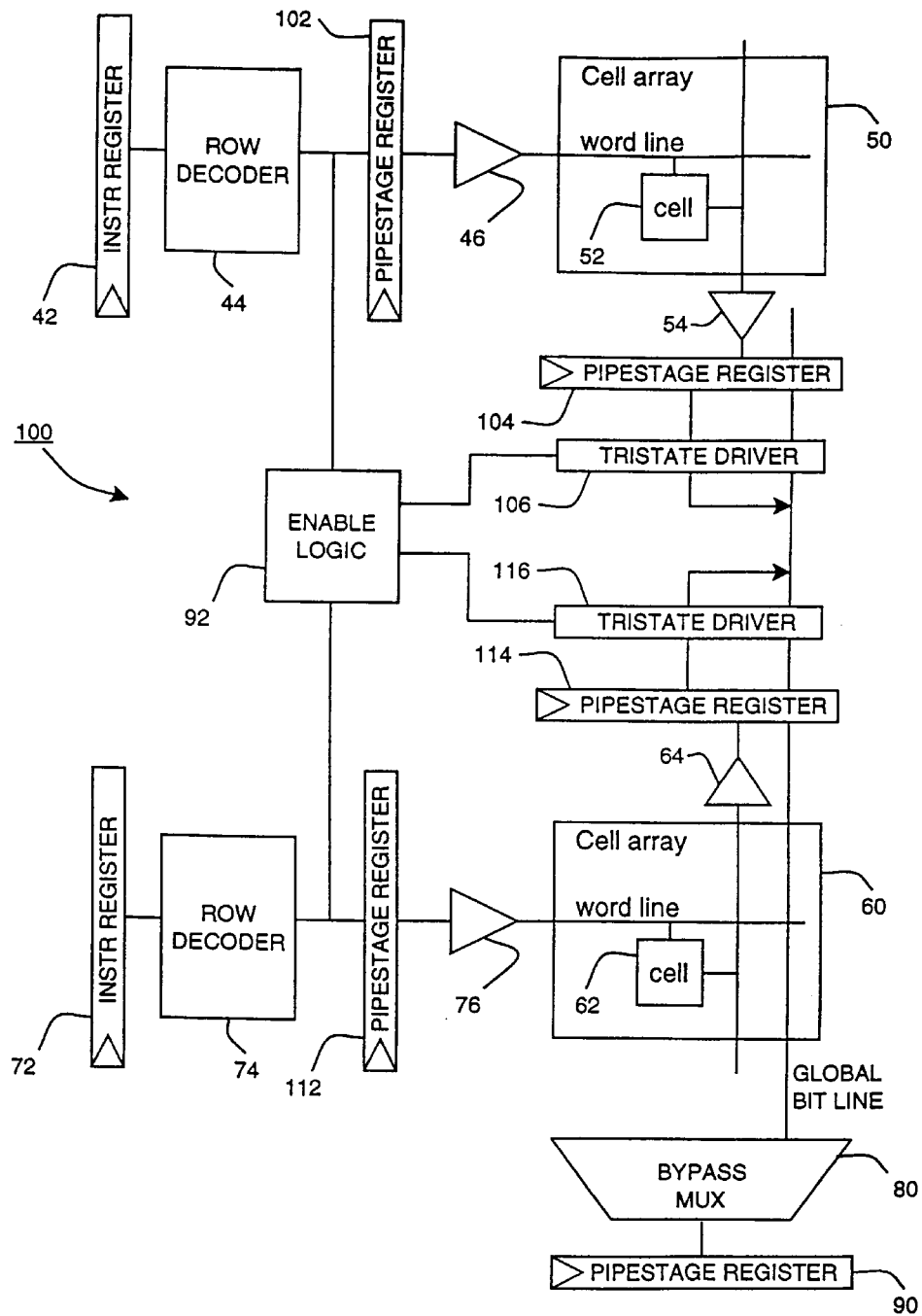
FIG. 5 is a block diagram of a register file organization according to the present invention for a microprocessor having a pipelined architecture.

Referring now to FIG. 5, a pipelined register file organization 100 according to the invention is shown. The register file organization retains the two micro-register files 50 and 60 of FIG. 4 for illustrative purposes but can also be applied to an undivided register file organization.

In register file 100, pipestage register 104 and tristate driver 106 are interposed sense amp 54 and the GLOBAL BIT LINE. Similarly, pipestage register 114 and tristate driver 116 are also interposed sense amp 64 and the GLOBAL BIT LINE. The addition of pipestage register 104 creates two pipestages: (1) a pipestage (REG ACCESS A) containing the delay associated with row decoder 44, word line driver 46, cell 52, the LOCAL BIT LINE for cell 52 and sense amp 54 with the addition of the set-up time for pipestage register 104; and (2) a separate pipestage (BYPASS) containing the delay associated with tristate driver 106, the GLOBAL BIT LINE and bypass MUX 80 along with the set-up time for pipestage register 90. The addition of pipestage register 114 and tristate driver 116 obtain the corresponding pipestage division with regard to cell array 60. Thus, by the addition of pipestage registers 104 and 114, the register access pipestage of the conventional device in FIG. 4 can be divided into two pipestages each having less delay.

The pipestage created through the addition of pipestage registers 104 and 114, along with tristate drivers 106 and 116, accommodates the time required for bank selection between the register banks in each of cell array 50 and 60 that is performed by enable logic 92 as well as the time required to drive the GLOBAL BIT LINE. This pipestage can also easily accommodate the bypass multiplexor function along with the wire delays associated with the bypass multiplexor 80. In addition, it is possible in some configurations that enough time will remain in the pipestage cycle for a functional unit, such as an arithmetic logic unit (ALU), to perform an operation on the operands obtained from the registers in cell arrays 50 and 60.

One way that the register file 100 can operate is that pipestage register 104 latches, at the end of one pipeline cycle, the contents of the selected register in cell array 50 which then propagates through bypass MUX 80 to the next pipestage register 90 during a subsequent pipeline cycle. If the selected register resides in cell array 60, then pipestage register 114 latches, at the end of one pipeline cycle, the contents of the selected register in cell array 60 which then propagates through bypass MUX 80 to the next pipestage register 90 during the subsequent pipeline cycle.

Note that tristate drivers 106 and 116 can be omitted if pipestage registers 104 and 114 are tristatable devices. In addition, due to the use of tristate devices to drive the GLOBAL BIT LINE, the bypass function performed by bypass multiplexor 80 can be performed instead by the tristatable devices thus eliminating the need for the bypass multiplexor. However, note that the addition of pipestage registers increases the loading on the clock signal used to drive the instruction pipeline containing the pipestage registers.

The register file 100 is shown having a single read port. However, the present invention can be extended to multiple ports in which case multiple pipestage registers, and their attendant tristate drivers, would be present in place of each of pipestage registers 104 and 114. For instance, a multiple functional unit microprocessor having two read ports per functional unit will have a pair of pipestage registers for each functional unit connected to an output port from each cell array, or micro-register file, where the cell array would have two ports for each functional unit. Also, there would be an instruction register corresponding to each functional unit driving each micro-register file.

Figure 6A:
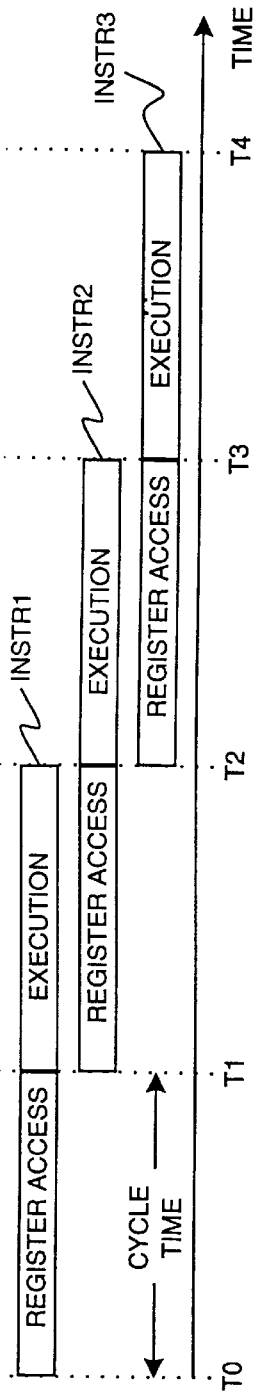
FIG. 6A is a timing diagram illustrating an example of successive pipeline stages of a microprocessor having the conventional register file organization shown in FIG. 4.
Figure 6B:
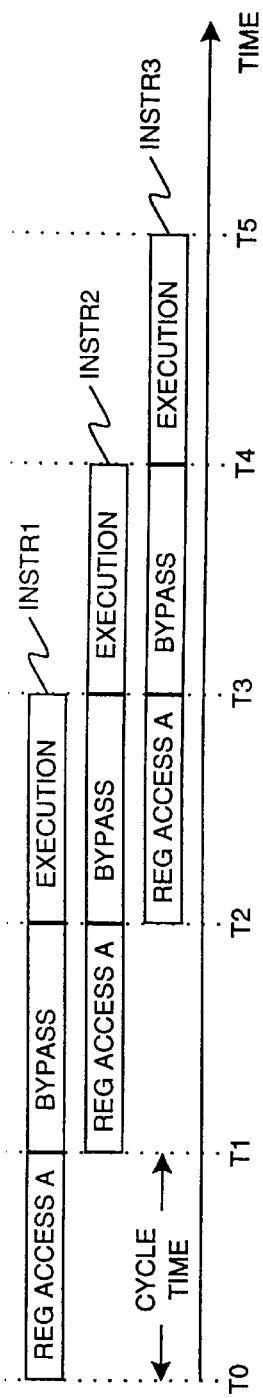
FIG. 6B is a timing diagram illustrating successive pipeline stages of a microprocessor having a register file organization which includes pipestage registers 104 and 114 shown in FIG. 5.

FIG. 6B illustrates a simplified example of successive pipestages in a microprocessor pipeline wherein pipestage registers 104 and 114 are incorporated into the register file of the pipeline (but where pipestage registers 102 and 112 are not present). The REGISTER ACCESS pipestage of FIG. 6A is divided into pipestages REG ACCESS A and BYPASS in FIG. 6B and described above and the microprocessor pipeline is deeper.

Some additional delay can be introduced due to the set-up time required for pipestage registers 104 and 114 and for tristate drivers 106 and 116 which can result in each individual instruction taking a longer period of time to complete execution, which is illustrated by comparing the time interval from T0 to T2 for INSTR1 to execute in FIG. 6A with the longer time interval from T0 to T3 for INSTR1 to execute in FIG. 6B. However, the CYCLE TIME for each pipestage is reduced by the division of the REGISTER ACCESS pipestage into stages REG ACCESS A and BYPASS. (Also note that, if the time interval required for the REGISTER ACCESS pipestage of FIG. 6A is much larger than the time interval required for any other pipestage, then the delay associated with the additional pipestage registers 104 and 114 will not increase the overall time required for execution of an instruction and can actually shorten the overall execution time.)

Thus, once the microprocessor pipeline is full, an instruction will complete execution at the end of each CYCLE TIME, at times T3, T4 and T5 in the example of FIG. 6B, which can result in faster overall processor operation. In this manner, overall microprocessor execution speed is improved, which is demonstrated by comparing the time interval from T0 to T4 required for instructions INSTR1, INSTR2 and INSTR3 to execute in FIG. 6A with the shorter time interval from T0 to T5 required for instructions INSTR1, INSTR2 and INSTR3 to execute in FIG. 6A.

In addition, CYCLE TIME can be further reduced, and microprocessor performance increased, by further dividing the register pipestage REG ACCESS A above. Pipestage register 102 is interposed row decoder 44 and word line driver 46 and pipestage register 112 interposed row decoder 74 and word line driver 76 in order to separate the delay associated with row decoders 44 and 74, respectively, into a separate instruction decode (INSTR DEC) pipestage. The INSTR DEC pipestage includes the delay associated with the row decoder 44 with the addition of the set-up time for pipestage register 102. The delay associated with word line driver 46, cell 52, the LOCAL BIT LINE for cell 52 and sense amp 54 along with the set-up time for pipestage register 104 is separated into another pipestage REG ACC B. Thus, with the further addition of pipestage registers 102 and 112, the REGISTER ACCESS pipestage of FIG. 6A is divided into three pipestages INSTR DEC, REG ACC B and BYPASS of FIG. 6C.

With the additional pipeline cycle created through the addition of pipestage registers 102 and 112, one way that register file 100 can operate is that a instruction in instruction register 42 is decoded by row decoder 44 and latched by pipestage register 102 at the end of a first pipeline cycle. The decoded selection signal latched into pipestage register 102 then propagates through word line driver 46, cell array 50 and sense amp 54 to the next pipestage register 104 during a second pipeline cycle. The contents of the selected register in cell array 50 is latched into pipestage register 104 and propagates through tristate driver 106, the GLOBAL BIT LINE and bypass MUX 80 to the next pipestage register 90 during a third pipeline cycle. Register decodes involving cell array 60 will proceed in a similar manner.

Figure 6C:
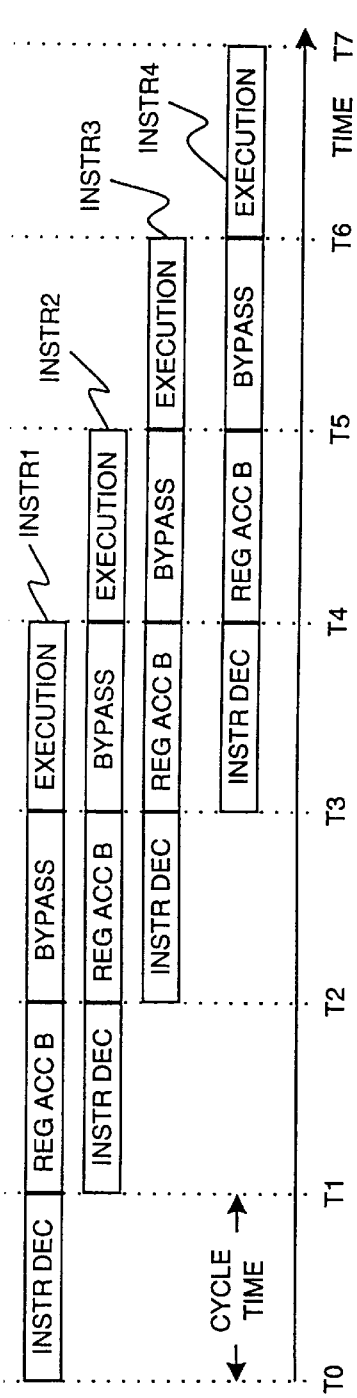
FIG. 6C is a timing diagram illustrating successive pipeline stages of a microprocessor having the register file organization which includes pipestage registers 104 and 114 and pipestage registers 102 and 112 shown in FIG. 5.

As with the addition of pipestage registers 104 and 114, the addition of the set-up time for pipestage registers 102 and 112 can result in an increase in the execution time for an individual instruction. Thus, the interval from T0 to T4 for INSTR1 to execute in FIG. 6C is longer than both the interval from T0 to T3 in FIG. 6B and the interval from T0 to T2 in FIG. 6A. However, the CYCLE TIME for the register file which includes pipestage registers 102 and 112 is reduced towards the fundamental minimum limit achievable in pipelined microprocessor architecture. Once the deeper pipeline of the present invention is full, instructions will typically be completing execution in each operational cycle which will result in higher overall performance of the pipeline.

Single cycle execution is still maintained in the pipeline by bypassing results from each EXECUTION pipestage to the BYPASS stage. The deeper pipeline resulting from the additional pipestage can increase the misprediction penalty associated with branches in the instructions. However, branch prediction algorithms can mitigate the misprediction penalty and microprocessor performance will be significantly improved in code which is characterized by large logical loops.

As should be apparent to those skilled in the art of computer design, although the principles taught herein are presented in the context of a register file divided into two sub-files, the principles of the present invention can be extended to register files composed of any number of micro-register files including an undivided register file. Furthermore, though the illustrated embodiment indicates a single read port for the cell array, it should be understood that the present invention can be extended to register files having multiple read ports and multiple write ports. Also, the pipestage diagrams presented above are simplified examples and an actual pipeline will likely include other pipestages such as an instruction fetch stage or a write back stage.

Having described and illustrated the principles of the invention in a preferred embodiment thereof, it should be apparent that the invention can be modified in arrangement and detail without departing from such principles. We claim all modifications and variation coming within the spirit and scope of the following claims.

What is claimed is:

1. A register file for a pipelined computer architecture the register file comprising:
    a first instruction register configured to receive an instruction;
    a first cell array including a first plurality of registers;
    a first instruction decoder coupled between the first cell array and the first instruction register and being configured to generate a first word line signal in order to select one of the first plurality of registers responsive to the instruction in the first instruction register;
    a bypass multiplexor configured to receive the content of the selected one of the first plurality of registers; and
    a first pipestage register coupled between the bypass multiplexor and the first cell array and being configured to latch the content of the selected one of the first plurality of registers.

2. The register file of claim 1, further comprising:
    a second pipestage register interposed the first instruction decoder and the first cell array and being configured to latch the first word line signal output from the first instruction decoder.

3. The register file of claim 2, wherein the first instruction register, the first pipestage register and the second pipestage register are driven by a pipeline clock signal.

4. The register file of claim 1, further comprising:
    a second instruction register configured to receive the instruction;
    a second cell array including a second plurality of registers;
    a second instruction decoder coupled between the second cell array and the second instruction register and being configured to generate a second word line signal in order to select one of the second plurality of registers responsive to the instruction in the second instruction register; and
    a third pipestage register interposed the bypass multiplexor and the second cell array and being configured to latch the content of the selected one of the second plurality of registers.

5. The register file of claim 4, further comprising:
    a second pipestage register interposed the first instruction decoder and the first cell array and being configured to latch the first word line signal output from the first instruction decoder; and
    a fourth pipestage register interposed the second instruction decoder and the second cell array and being configured to latch the second word line signal output from the second instruction decoder.

6. The register file of claim 5, wherein the first and second instruction registers and the first, second, third and fourth pipe pipestage registers are driven by a pipeline clock signal.

7. The register file of claim 4 wherein the first and third pipeline registers are tristatable registers.

8. The register file of claim 7 further including enable logic configured to enable the first pipeline register responsive to the first word line signal and enable the third pipeline register responsive to the second word line signal.

9. The register file of claim 4, further including:
    a first tristatable driver interposed the first pipeline register and the bypass multiplexor; and
    a second tristatable driver interposed the third pipeline register and the bypass multiplexor.

10. The register file of claim 9 further including enable logic configured to enable the first tristatable driver during the second pipeline cycle responsive to the first word line signal and enable the second tristatable driver responsive to the second word line signal.

11. A register file for a pipelined computer architecture, the register file comprising:
   a first instruction register configured to receive an instruction;
   a first cell array including a first plurality of registers;
   a first instruction decoder coupled between the first cell array and the first instruction register and being configured to generate a first word line signal in order to select one of the first plurality of registers responsive to the instruction in the first instruction register;
   a first pipestage register coupled between the first instruction decoder and the first cell array and being configured to latch the first word line signal; and
   a bypass multiplexor configured to receive the content of the one of the first plurality of registers selected responsive to the first word line signal.

12. The register file of claim 11, further comprising:
   a second instruction register configured to receive the instruction;
   a second cell array including a second plurality of registers
   a second instruction decoder coupled between the second cell array and the second instruction register and being configured to generate a second word line signal in order to select one of the second plurality of registers responsive to the instruction in the second instruction register;
   a second pipeline register interposed the second instruction decoder and the second cell array and being configured to latch the second word line signal; and
   wherein the bypass multiplexor is further configured to receive the content of the one of the second plurality of registers selected responsive to the second word line signal.

13. A method for minimizing a cycle time of a pipelined microprocessor having a register file, the method comprising the steps:
   providing a first micro-register file including a first plurality of data registers;
   latching an instruction in a first instruction register;
   decoding the instruction in the first instruction register to generate a first register selection signal;
   enabling one of the first plurality of data registers responsive to the first register selection signal;
   latching the content of the enabled one of the first plurality of registers into a first pipestage register; and
   driving the content of the first pipestage register onto a global bit line.

14. The method of claim 13, further including the step of latching the first register selection signal into a second pipestage register.

15. The method of claim 13, further including the steps:
   providing a second micro-register file including a second plurality of data registers;
   latching the instruction into a second instruction register; and wherein:
      the step of enabling one of the first plurality of data registers responsive to the register selection signal further includes enabling a selected register in one of the first and second pluralities of data registers responsive to one of the first and second register selection signals;
      the step of latching the content of the one of the first plurality of registers into a first pipestage register further includes latching the content of the selected register of the first plurality of registers into the first pipestage register responsive to the first register selection signal; and
      the step of driving the content of the first pipestage register onto a global bit line further includes driving the content of one of the first and second pipestage registers onto the global bit line; and including the steps:
         decoding the instruction in the second instruction register to generate a second register selection signal; and
         latching the content of the selected register of the second plurality of registers into a second pipestage register responsive to the second register selection signal.

16. The method of claim 15, further including the steps:
   latching the first register selection signal into a third pipestage register; and
   latching the second register selection signal into a fourth pipestage register.

17. A method for dividing a register access pipeline stage in a microprocessor, the method comprising the steps:
   latching an instruction into a first instruction register;
   decoding the instruction in the first instruction register in order to produce a first register selection signal;
   latching the first register selection signal produced from decoding the instruction in the first instruction register into a first pipestage register;
   enabling one of a first plurality of data registers in a first register file responsive to the first register selection signal latched into the first pipestage register; and
   driving the content of the one of the first plurality of data registers onto a global bit line.

18. The method of claim 17, further including:
   latching the instruction into a second instruction register;
   decoding the instruction in the second instruction register in order to produce a second register selection signal;
   latching the second register selection signal into a second pipestage register; and wherein:
      the step of enabling one of a first plurality of data registers in a first register file responsive to the first register selection signal further includes enabling a selected register in one of the first plurality of data registers in the first register file and a second plurality of data registers in a second register file; and
      the step of driving the content of the one of the first plurality of data registers onto a global bit line further includes driving the content of the selected register onto the global bit line.

19. A register file for a pipelined computer architecture, the register file comprising:
   a first instruction register configured to receive an instruction;
   a first cell array including a first plurality of registers;
   a first instruction decoder coupled between the first cell array and the first instruction register and being configured to generate a first word line signal in order to select one of the first plurality of registers responsive to the instruction in the first instruction register;
   a global bit line configured to receive the content of the selected one of the first plurality of registers; and
   a first pipestage register coupled between the global bit line and the first cell array and being configured to latch the content of the selected one of the first plurality of registers.

* * * * *